United States Patent
Wang

(10) Patent No.: US 11,302,562 B2
(45) Date of Patent: Apr. 12, 2022

(54) METHOD AND APPARATUS FOR MASS TRANSFER OF MICRO LEDS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventor: Guohua Wang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 16/770,410

(22) PCT Filed: Feb. 17, 2020

(86) PCT No.: PCT/CN2020/075535
§ 371 (c)(1),
(2) Date: Jun. 5, 2020

(87) PCT Pub. No.: WO2020/199771
PCT Pub. Date: Oct. 8, 2020

(65) Prior Publication Data
US 2021/0233795 A1   Jul. 29, 2021

(30) Foreign Application Priority Data

Mar. 29, 2019   (CN) .................. 201910253178.X

(51) Int. Cl.
*H01L 21/683*   (2006.01)
*H01L 21/66*   (2006.01)
(Continued)

(52) U.S. Cl.
CPC .......... *H01L 21/6835* (2013.01); *H01L 22/20* (2013.01); *H01L 25/0753* (2013.01);
(Continued)

(58) Field of Classification Search
CPC . H01L 21/6835; H01L 25/0753; H01L 33/62; H01L 33/0095; H01L 22/20;
(Continued)

(56) References Cited

U.S. PATENT DOCUMENTS

| 6,488,721 B1 | 12/2002 | Carlson |
| 7,560,803 B2 * | 7/2009 | Onozawa ............... H01L 24/95 257/656 |
| 7,662,008 B2 * | 2/2010 | Hillis .................... H01L 24/95 445/24 |
| 7,727,804 B2 * | 6/2010 | Smith .................... H01L 24/82 438/107 |

(Continued)

FOREIGN PATENT DOCUMENTS

| CN | 206444901 U | 8/2017 |
| CN | 107910413 A | 4/2018 |

(Continued)

OTHER PUBLICATIONS

First Chinese Office Action dated Jun. 2, 2020, received for corresponding Chinese Application No. 201910253178.X, 23 pages.

*Primary Examiner* — Vu A Vu
(74) *Attorney, Agent, or Firm* — Kinney & Lange, P.A.

(57) ABSTRACT

The present disclosure provides a method and an apparatus for mass transfer of Micro LEDs. In one embodiment, the method comprises: providing Micro LED chips; dumping at one time Micro LED chips onto a transfer surface of a transfer mold, the transfer surface being formed with transfer cavities; and vibrating the transfer mold to cause the Micro LED chips to fall into shape-matched transfer cavities respectively, and tilting the transfer mold so that the Micro LED chips that have not fallen into the transfer cavities leave the transfer surface.

9 Claims, 3 Drawing Sheets

(51) Int. Cl.
*H01L 25/075* (2006.01)
*H01L 33/00* (2010.01)
*H01L 33/62* (2010.01)

(52) U.S. Cl.
CPC .......... *H01L 33/0095* (2013.01); *H01L 33/62* (2013.01); *H01L 2221/68354* (2013.01); *H01L 2221/68368* (2013.01); *H01L 2933/0066* (2013.01)

(58) Field of Classification Search
CPC . H01L 2221/68354; H01L 2221/68368; H01L 2933/0066
USPC .......................................................... 438/7
See application file for complete search history.

(56) References Cited

U.S. PATENT DOCUMENTS

| | | | |
|---|---|---|---|
| 10,543,486 B2 * | 1/2020 | Sasaki | H01L 24/29 |
| 10,566,494 B2 | 2/2020 | Zou | |
| 2017/0133558 A1 * | 5/2017 | Sasaki | H01L 33/62 |

FOREIGN PATENT DOCUMENTS

| | | |
|---|---|---|
| CN | 108431971 A | 8/2018 |
| CN | 109065677 A | 12/2018 |
| CN | 109950182 A | 6/2019 |
| CN | 110047785 A | 7/2019 |
| CN | 110349989 A | 10/2019 |
| JP | 61282218 A | 12/1986 |

* cited by examiner

METHOD AND APPARATUS FOR MASS TRANSFER OF MICRO LEDS

CROSS-REFERENCE TO RELATED APPLICATION

This application is a Section 371 National Stage Application of International Application No. PCT/CN2020/075535, filed Feb. 17, 2020, which in turn claims priority to Chinese Patent Application No. 201910253178.X filed on Mar. 29, 2019 in the China National Intellectual Property Administration, the disclosure of which is hereby incorporated by reference in its entirety.

TECHNICAL FIELD

The present disclosure relates to a field of Micro LED manufacturing technology, and particularly, to a method and an apparatus for mass transfer of Micro LEDs.

BACKGROUND

Compared with liquid crystal display panels of related art, Micro LED (Micro Light Emitting Diode) display panels have the advantages of higher resolution, better contrast, faster response time and lower energy consumption, and are therefore regarded as the next generation display technology. After the manufacture of Micro LED chips is completed, tens of thousands to hundreds of thousands of Micro LED chips need to be transferred to a drive circuit board to form an LED array. This process is called "mass transfer". Due to a small size of Micro LED, how to ensure the transfer efficiency and yield simultaneously has become a major problem in the industrialization process of Micro LED.

In the related art, for the mass transfer process of the red, blue and green (RGB) three-color Micro LEDs, the transfer method is generally performed in stages, that is, only Micro LED chips with one same color can be transferred at a time, and the corresponding shaped Micro LED chips fall into transfer cavities under actions of vibration and wind. Therefore, for the RGB three-color Micro LED chips of the same shape, a mass transfer process is required to be performed three times. Although this method is simple in process and high in yield, the efficiency is low.

Therefore, the current mass transfer technology of Micro LEDs still needs to be improved.

SUMMARY

According to an aspect of the present disclosure, there is provided a method for mass transfer of Micro LEDs, comprising:

providing Micro LED chips, the Micro LED chips comprising first Micro LED chips capable of emitting a first color and second Micro LED chips capable of emitting a second color, the first color being different from the second color, a shape of the first Micro LED chip being different from a shape of the second Micro LED chip;

dumping at one time the first Micro LED chips and the second Micro LED chips onto a transfer surface of a transfer mold, the transfer surface being formed with first type transfer cavities and second type transfer cavities, the first type transfer cavity having a first shape that matches the shape of the first Micro LED chip, the second type transfer cavity having a second shape that matches the shape of the second Micro LED chip; and vibrating the transfer mold to cause the first and second Micro LED chips to fall into shape-matched first and second type transfer cavities respectively, and tilting the transfer mold so that the Micro LED chips that have not fallen into the first and second type transfer cavities leave the transfer surface.

In some embodiments, a lateral section of the first Micro LED chip is different in shape from a lateral section of the second Micro LED chip.

In some embodiments, each of the first and second Micro LED chips has a substantially trapezoidal or triangular lateral section.

In some embodiment, each of the first and second Micro LED chips has a substantially trapezoidal longitudinal section.

In some embodiments, the trapezoidal longitudinal section of each of the first and second Micro LED chips has an included angle in a range of approximately 75° to approximately 85°.

In some embodiments, a ratio of the first Micro LED chips to the second Micro LED chips in quantity is approximately 1:1.

In an exemplary embodiment, the Micro LED chips further comprise third Micro LED chips capable of emitting a third color, the third color being different from the first color and the second color, a shape of the third Micro LED chip being different from the shape of the first Micro LED chip and the shape of the second Micro LED chip; and the transfer surface of the transfer mold is provided with third type transfer cavities, the third type transfer cavity having a third shape that matches the shape of the third Micro LED chip.

In an exemplary embodiment, a lateral section of the first Micro LED chip is different in shape from a lateral section of the second Micro LED chip, and a lateral section of the third Micro LED chip is different in shape from both the lateral section of the first Micro LED chip and the lateral section of the second Micro LED chip.

In an exemplary embodiment, each of the first, second and third Micro LED chips has a substantially trapezoidal or triangular lateral section.

In an exemplary embodiment, the first Micro LED chip has an isosceles trapezoidal lateral section, the second Micro LED chip has a right-angle-at-left trapezoidal lateral section, and the third Micro LED chip has a right-angle-at-right trapezoidal lateral section.

In an exemplary embodiment, each of the first, second and third Micro LED chips has a substantially trapezoidal longitudinal section.

In an exemplary embodiment, the trapezoidal longitudinal section of each of the first, second and third Micro LED chips has an included angle within a range of approximately 75° to approximately 85°.

In an exemplary embodiment, a ratio of the first Micro LED chips, the second Micro LED chips to the third Micro LED chips in quantity is approximately 1:1:1.

In an exemplary embodiment, an angle of tilting of the transfer mold is within a range of approximately 15° to approximately 30°.

In an exemplary embodiment, the method may further comprises: detecting the transfer surface with an automatic optical inspection equipment, and filling, with a manipulator, empty transfer cavities with the shaped-matched Micro LED chips respectively; testing component function of the Micro LED chips on the transfer mold, removing, with the manipulator, defective Micro LED chips, and then filling non-defective shaped-matched Micro LED chips; and soldering and packaging the Micro LED chips on the transfer mold to a circuit board in position.

In another aspect of the present disclosure, there is provided an apparatus for mass transfer of Micro LEDs, comprising:

a transfer mold, having a transfer surface that is formed with transfer cavities of different types, the transfer cavities of different types having different shapes, the transfer cavities of each type having a shape suitable to match a shape of Micro LED chips with one same color; and a vibrating source in contact with the transfer mold.

In some embodiments, each of the transfer cavities has a vacuum suction hole provided at a bottom thereof.

In some embodiments, each of the transfer cavities has a depth in a range of approximately 2.5 microns to approximately 5 microns.

Additional aspects and advantages of the present disclosure will be partially given in the following description, and some will become apparent from the following description, or be learned through practice of the present disclosure.

DETAILED DESCRIPTION OF THE EMBODIMENTS

Figure 1:
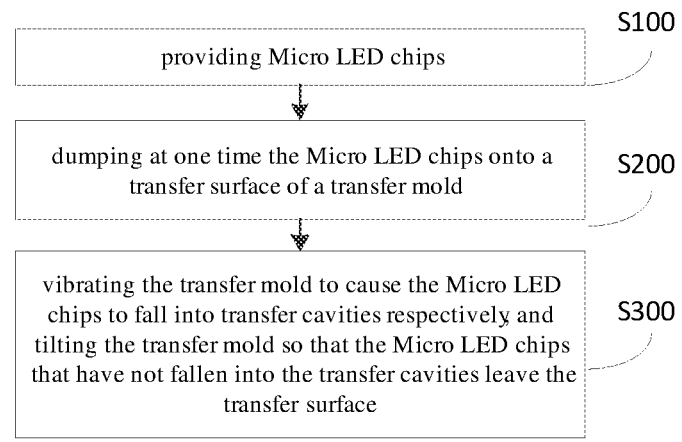
FIG. 1 is a schematic flowchart of a method for mass transfer of Micro LEDs according to an embodiment of the present disclosure.

The embodiments of the present disclosure are described in detail below. Those skilled in the art will understand that the following embodiments are intended to explain the present disclosure, and should not be regarded as limiting the present disclosure. Unless specifically stated, specific technologies or conditions are not explicitly described in the following embodiments, those skilled in the art can follow the common technologies or conditions in the field or according to the product specification.

The present disclosure is based on the inventor's following findings.

In the course of research, the inventor of the present disclosure has proposed a method for mass transfer of Micro LEDs. Micro LED chips of different colors are designed to have different shapes, and multiple types of transfer cavities are formed on the transfer mold, each type of transfer cavities has a corresponding shape that matches the shape of the Micro LED chips of one color, so that the Micro LED chips of each color will only be filled into the type of transfer cavities having the corresponding shape, which can realize huge transfer process of Micro LED chips of many different colors at one time, so as to improve the transfer efficiency exponentially while ensuring a high transfer yield.

According to an inventive concept of the present disclosure, there is provided a method for mass transfer of Micro LEDs, comprising: providing Micro LED chips, the Micro LED chips comprising first Micro LED chips capable of emitting a first color and second Micro LED chips capable of emitting a second color, the first color being different from the second color, a shape of the first Micro LED chip being different from a shape of the second Micro LED chip; dumping at one time the first Micro LED chips and the second Micro LED chips onto a transfer surface of a transfer mold, the transfer surface being formed with first type transfer cavities and second type transfer cavities, the first type transfer cavity having a first shape that matches the shape of the first Micro LED chip, the second type transfer cavity having a second shape that matches the shape of the second Micro LED chip; and vibrating the transfer mold to cause the first and second Micro LED chips to fall into the shape-matched first and second type transfer cavities respectively, and tilting the transfer mold so that the Micro LED chips that have not fallen into the first and second type transfer cavities leave the transfer surface. Further, a lateral section of the first Micro LED chip is different in shape from a lateral section of the second Micro LED chip. For example, each of the first and second Micro LED chips has a substantially trapezoidal or triangular lateral section. Furthermore, each of the first and second Micro LED chips has a substantially trapezoidal longitudinal section. The trapezoidal longitudinal section of each of the first and second Micro LED chips has an included angle in a range of approximately 75° to approximately 85°. A ratio of the first Micro LED chips to the second Micro LED chips in quantity is approximately 1:1. An angle of tilting of the transfer mold in a range of approximately 15° to approximately 30°.

According to an aspect of the present disclosure, referring to FIG. 1, the method for mass transfer of Micro LEDs comprises the following steps.

Step S100 is to provide Micro LED chips, the Micro LED chips comprising first Micro LED chips capable of emitting a first color and second Micro LED chips capable of emitting a second color, the first color being different from the second color, a shape of the first Micro LED chip being different from a shape of the second Micro LED chip.

In this step, Micro LED chips 100 of multiple colors are provided, and the shape of the Micro LED chip 110 capable of emitting the first color is different from the shape of the second Micro LED chip 120 capable of emitting the second color. In this way, the Micro LED chips 100 of different colors can have different shapes.

According to embodiments of the present disclosure, the lateral section of the first Micro LED chip 110 is different in shape from the lateral section of the second Micro LED chip 120. The specific shape of the lateral section of the Micro LED chips 100 can be designed accordingly by those skilled in the art according to the specific arrangement of the Micro LED component array, such as a triangle or a quadrilateral. In some embodiments of the present disclosure, the lateral section of the Micro LED chip 100 may be trapezoidal, for example, a trapezoid of which upper, lower, left, and right sides are asymmetrical, so that the shape of the Micro LED chips 100 may be different even after being flipped or turned, therefore, the matching of Micro LED chips 100 of different colors with different types of transfer cavities 220 on the transfer mold 200 can be made higher.

According to the embodiments of the present disclosure, the specific color number of the Micro LED chips 100 is also not particularly limited, and those skilled in the art can design accordingly according to the color design of the Micro LED component array.

Figure 2:
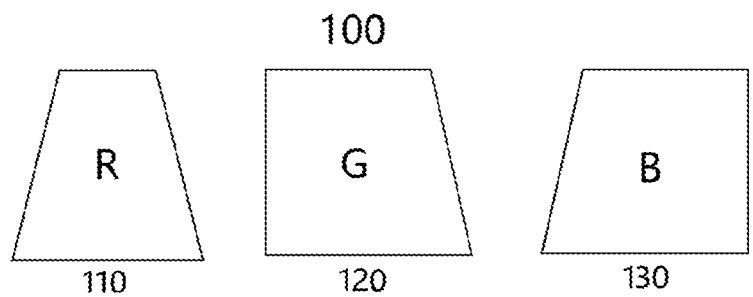
FIG. 2 is a schematic structural diagram in bottom view of three-color Micro LED chips according to an embodiment of the present disclosure.

In an exemplary embodiment of the present disclosure, referring to FIG. 2, the Micro LED chips 100 may include a first Micro LED chip 110 (e.g., red R), a second Micro LED chip 120 (e.g., green G), and a third Micro LED chip 130 (e.g., blue B). The shape of the first Micro LED chip 110 is different from the shape of the second Micro LED chip 120, and the shape of the third Micro LED chip 130 is different from both the shape of the first Micro LED chip 110 and the shape of the second Micro LED chip 120. In the exemplary embodiment shown in the figure, the lateral section of the first Micro LED chip 110 may be an isosceles trapezoid, the lateral section of the second Micro LED chip 120 may be a right-angle-at-left trapezoid, and the lateral section of the third Micro LED chip 130 may be a right-angle-at-right trapezoid. In this way, the shape of the Micro LED chips of the three colors can be greatly different.

In some specific examples, the longitudinal section of the Micro LED chip 100 may be rectangular. Thus, the prismatic Micro LED chip 100 of equal width at the top and bottom will not easily fall out of the transfer cavities 220 on the transfer mold 200. Even if the transfer mold is subsequently tilted at a large angle, the Micro LED chips 100 have fallen into the transfer cavities 220 are not easy to come off.

Figure 3:
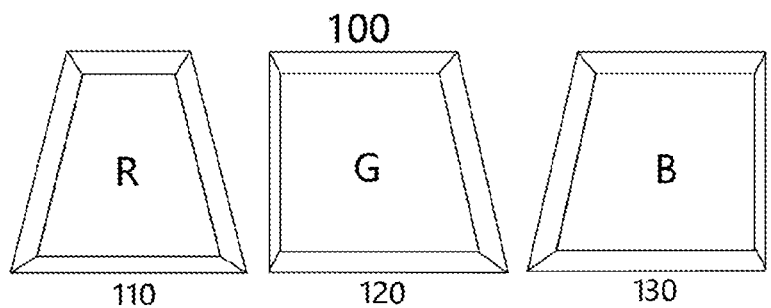
FIG. 3 is a schematic structural diagram in bottom view of three-color Micro LED chips according to another embodiment of the present disclosure.
Figure 4:
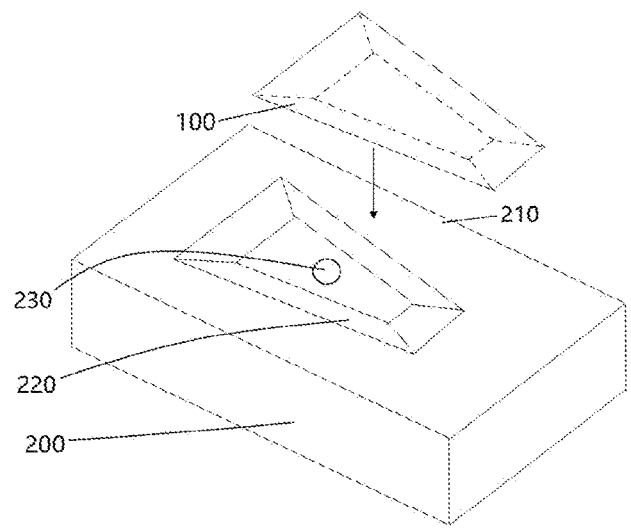
FIG. 4 is a schematic diagram of the shape matching between a Micro LED chip and a transfer cavity of the transfer mold according to an embodiment of the present disclosure.

In some other specific examples, referring to FIG. 3, the longitudinal section of the Micro LED chip 100 may also be trapezoidal. Thus, referring to FIG. 4, the micro LED chip 100 with a truncated pyramid shape in upper and lower dimensions can only fall into the transfer cavities 220 with matching shapes. Specifically, one kind of Micro LED chips can only fall into the corresponding type of transfer cavities that match its shape but not other types of transfer cavities that do not match its shape, (for example, the first Micro LED chip 110 can only fall into the first type of transfer cavities 221 but cannot fall into the second type of transfer cavities 222 and the third type of transfer cavities 223), on this basis, the first Micro LED chip 110 with an isosceles trapezoidal shape with bilateral symmetry cannot fall into the first transfer cavities 221 after being flipped, the second Micro LED chip 120 and the third Micro LED chip 130, which are mirror-symmetrical to each other, cannot fall into each other's transfer cavities after being flipped, thereby improving the yield of the production. Further, the included angle of the trapezoidal longitudinal section may be in a range of approximately 75° to approximately 85°. Thus, the probability that the Micro LED chips 100 of truncated pyramid shape using the above included angle range falls into the matching transfer cavities 220 is higher. In addition, referring to FIG. 4, after the Micro LED chip 100 is dropped, it can also be suctioned by the vacuum suction holes 230 at the bottom of the transfer cavity 220, and subsequent tilting will not make the Micro LED chip 100 that has fallen into the transfer surface 220 easily comes off.

Figures 5A, 5B:
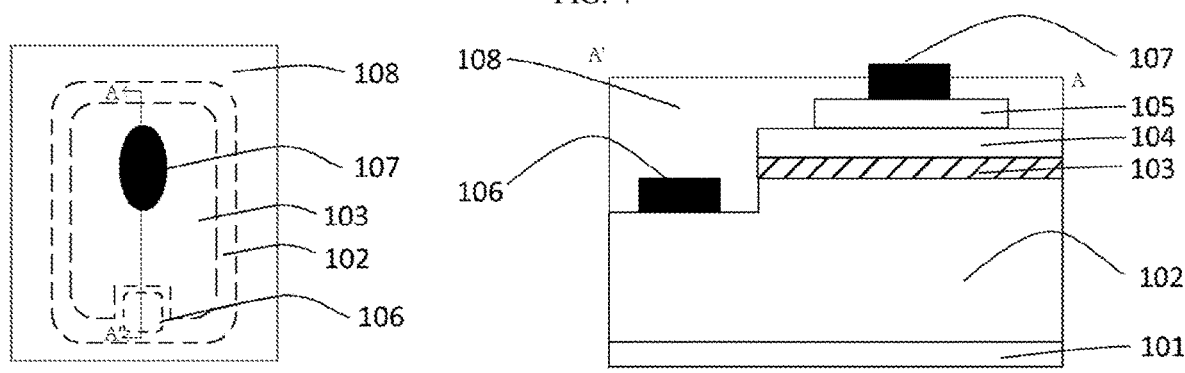
FIG. 5a is a schematic structural diagram in bottom view of a Micro LED chip according to an embodiment of the present disclosure.
FIG. 5b is a partial cross-sectional structure diagram of the Micro LED chip in FIG. 5a along the line A-A'.

According to the exemplary embodiments of the present disclosure, referring to FIG. 5a and FIG. 5b, each Micro LED chip 100 may include a gallium nitride (GaN) epitaxial layer 101, an N-type GaN layer 102, an InGaN/GaN light-emitting layer 103, a P-type GaN layer 104, a Ni/Au transparent conductive layer 105, an N-type electrode 106, a P-type electrode 107 and a color layer 108. Specifically, the N-type GaN layer 102 is provided on a surface of the epitaxial layer 101, and the light-emitting layer 103 is provided on a part of a surface of the N-type GaN layer 102. The P-type GaN layer 104 is provided on a surface of the light-emitting layer 103. The transparent conductive layer 105 is provided on a part of a surface of the P-type GaN layer 104. The N-type electrode 106 is provided on a part of the surface of the N-type GaN layer 102, the P-type electrode 107 is provided on a part of the surface of the transparent conductive layer 105. The color layer 108 covers the N-type electrode 106, a part of the N-type GaN layer 102, a part of the P-type GaN layer 104, and a part of the transparent conductive layer 105. In this way, through the processes of photolithography, cleaning, etching, electrode fabrication, passivation, polishing, painting and cutting, etc., the Micro LED chip 100 with more perfect structure and function can be manufactured. It should be noted that, regarding the stacked structure of each Micro LED chip 100 composed of the above layers, the lateral section of each Micro LED chip 100 is approximately parallel to the lateral section of each layer, and the longitudinal section of each Micro LED chip 100 is approximately perpendicular to the lateral section of each layer.

A step S200 is to dump at one time the first Micro LED chips and the second Micro LED chips onto a transfer surface of a transfer mold.

Figure 6:
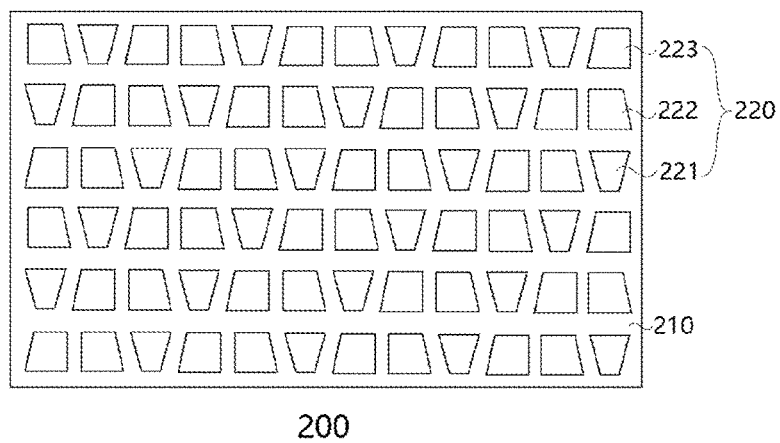
FIG. 6 is a schematic structural diagram in top view of a transfer mold according to an embodiment of the present disclosure.

In this step, excess Micro LED chips 100 are dumped onto the transfer surface 210 of the transfer mold 200. Referring to FIG. 6, the shape of the transfer cavities 220 (including the first type transfer cavities and the second type transfer cavities) on the transfer surface 210 is different. The first type transfer cavities have a first shape that matches the shape of the first Micro LED chip 110. The second type transfer cavities have a second shape that matches the shape of the second Micro LED chip 120, that is, the shape of one type of transfer cavities 220 matches the shape of the Micro LED chip 100 of one color. It should be noted that "matching" in this description specifically means that the shape of the transfer cavity 220 fits to the shape of the Micro LED chip 100, and the transfer cavity 220 and the Micro LED chip 100 also need to be in a bump fit.

In an exemplary embodiment of the present disclosure, for the Micro LED chips 100 of three colors, referring to FIG. 6, the transfer cavities 220 may also include first type transfer cavities 221, second type transfer cavities 222 and third type transfer cavities 223, and the shape of the first type transfer cavities 221 only matches the shape of the first Micro LED chips 110, namely only the first Micro LED chips 110 can fall into the first type transfer cavities 221, while neither the second Micro LED chips 120 nor the third Micro LED chips 130 can fall into the first type transfer cavities 221. In addition, the second type transfer cavities 222 only matches the shape of the second Micro LED chips 120, and the shape of the third type transfer cavities 223 only matches the shape of the third Micro LED chips 130. In this way, by designing multiple types of transfer cavities 220 with different shapes, the transfer mold 200 can be used to mass transfer three different colors of Micro LED chips 100 at one time.

In some embodiments of the present disclosure, the ratio of the first Micro LED chips 110, the second Micro LED chips 120 to the third Micro LED chips 130 in quantity may be approximately 1:1:1. Thus, for the transfer mold 200 arranged in a R/G/B sequential array as shown in FIG. 6, the ratio of the Micro LED chips 100 of the three colors can be more balanced, so that the probability of the Micro LED chips 100 of the three colors falling into the respective transfer cavities 220 is equal.

A step S300 is to vibrate the transfer mold to cause the first and second Micro LED chips to fall into shape-matched first and second type transfer cavities respectively, and to tilt the transfer mold so that the Micro LED chips that have not fallen into the first and second type transfer cavities leave the transfer surface.

In this step, the Micro LED chips 100 scattered on the transfer surface 210 are fallen into the transfer cavities 220 by vibrating, and the transfer mold 200 is tilted to make the Micro LED chips 100 that have not fallen into the transfer cavities 220 leave the transfer surface 210. In some embodiments of the present disclosure, the Micro LED chips 100 that have fallen into the transfer cavities 220 can also be suctioned by the vacuum suction holes 230 at the bottom of the transfer cavities 220, so tilting of the transfer mold 200 will not cause the Micro LED chips 100 that have fallen into the transfer cavities 200 to be easy to come off.

In some embodiments of the present disclosure, an angle of tilting of the transfer mold is in a range of approximately 15° to approximately 30°. In this way, by tilting the transfer mold 200 in the above-mentioned small angle range, the Micro LED chips 100 that have not fallen into the transfer cavities 220 can be separated from the transfer surface 210, so that no Micro LED chips 100 that have not fallen into the transfer cavities 220 will remain on the transfer surface 210.

In some embodiments of the present disclosure, as shown in FIG. 1, after the step S300, the method may further comprise the following steps.

A step S400 is to detect the transfer surface with an automatic optical inspection equipment, and to fill, with a manipulator 300, empty transfer cavities with the shape-matched Micro LED chips respectively.

Figure 7:
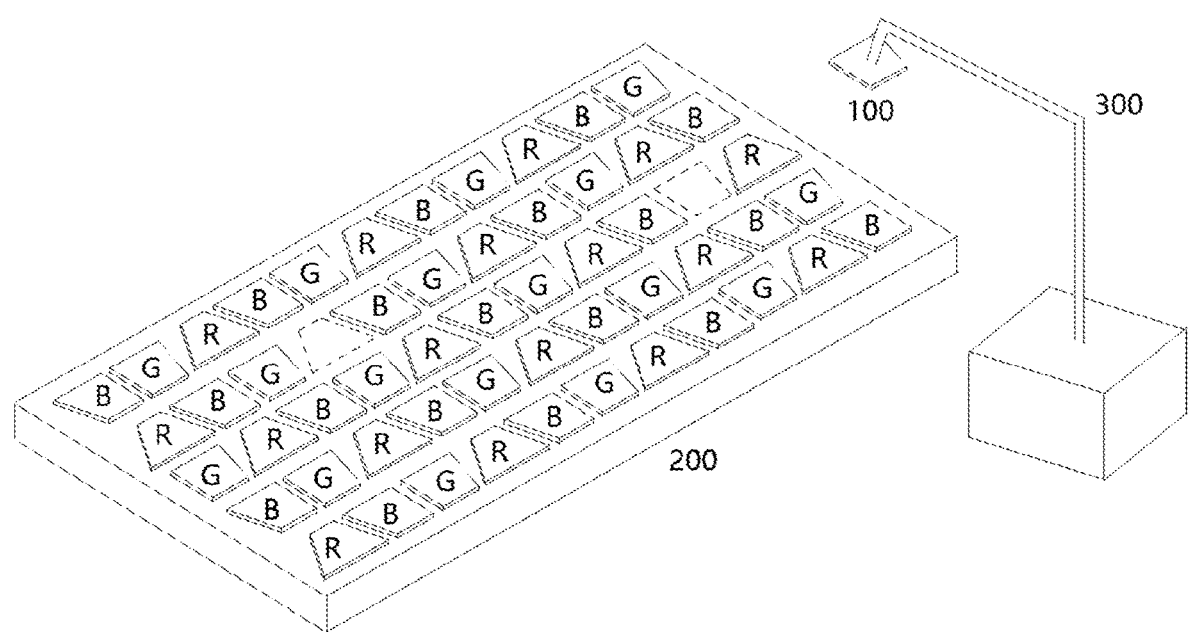
FIG. 7 is a schematic diagram of a filling process of a manipulator according to an embodiment of the present disclosure.

In this step, the automatic optical inspection equipment detects the transfer surface 210 and, referring to FIG. 7, by the manipulator 300, the empty transfer cavities 220 are filled with the shape-matched Micro LED chips 100.

A step S500 is to test component function of the Micro LED chips on the transfer mold, to remove, with the manipulator 300, defective Micro LED chips, and then to fill good Micro LED chips of the same shape.

In this step, the transfer mold 200 that has filled with the Micro LED chips 100 in the step S400 is connected to a test substrate to test the functions of the components, and then the manipulator 300 is used to remove the defective Micro LED chips 100 and then refill good Micro LED chips 100, as such, the inspection before soldering is completed.

A step S600 is to solder and package a circuit board to the Micro LED chips on the transfer mold in position.

In this step, a substrate for complementary metal oxide semiconductor (CMOS) or thin-film transistor (TFT) fabricated with the pixel drive circuit is soldered and packaged to the Micro LED chips 100 detected in step S500. In this way, addressing control and individual driving of each pixel can be realized, and the manufacturing method can allow Micro LED chips 100 of three or more different colors to be fabricated on the Micro LED substrate through one mass transfer, one soldering and packaging.

In summary, according to the embodiments of the present disclosure, the present disclosure proposes a mass transfer method, firstly Micro LED chips of different colors are designed to be different shapes, and then various types of transfer cavities on the transfer mold are designed to be different shapes, so that a mass transfer process of Micro LED chips of at least two colors can be realized at one time, and the shape of one type of transfer cavities on the transfer mold only matches the shape of Micro LED chips of one color, so as to improve the transfer efficiency exponentially, while ensuring a high transfer yield.

In an aspect of the present disclosure, the present disclosure provides an apparatus for mass transfer of Micro LEDs.

According to embodiments of the present disclosure, the apparatus for mass transfer of Micro LEDs comprises a transfer mold 200 and a vibrating source. A transfer surface of the transfer mold 200 is formed with transfer cavities 220 of different types, the transfer cavities 220 of different types have different shapes, and the transfer cavities 220 of each type having a shape suitable to match a shape of Micro LED chips of one color. The vibrating source is in contact with the transfer mold.

In some embodiments of the present disclosure, the apparatus for mass transfer of Micro LEDs may further comprise a blower, and the blower is disposed on one side of the transfer mold. In this way, the wind can assist the vibration to make the Micro LED chips fall into the transfer cavities 200 faster.

In some embodiments of the present disclosure, a bottom of each transfer cavity 220 may be provided with a vacuum suction hole 230. In this way, the Micro LED chip 100 of truncated pyramid shape falls into the transfer cavities 220 and can be suctioned by vacuum, so that tilting of the transfer mold 200 does not cause the problem that the Micro LED chips 100 come off the transfer cavities 220.

In some embodiments of the present disclosure, each transfer cavity 220 has a depth in a range of approximately 2.5 microns to approximately 5 microns. In this way, the Micro LED chip 100 with a thickness in a range of approximately 2.5 μm to approximately 5 μm can fall into the transfer cavities 220 at this depth, thereby making the one-time mass transfer shorter in time and more efficient.

According to embodiments of the present disclosure, the mass transfer apparatus may further include a vacuum component, the automatic optical inspection component, the manipulator 300, a test substrate, a soldering component, a packaging component, etc., those skilled in the art may supplement accordingly according to specific steps of the mass transfer method, which will not be repeated herein.

In summary, according to the embodiments of the present disclosure, the present disclosure proposes a mass transfer apparatus, in which multiple types of transfer cavities on the transfer surface of the transfer mold are designed into different shapes, and one type of transfer cavities has a shape suitable to match a shape of Micro LED chips of one color. In this way, the mass transfer apparatus can realize the transfer of Micro LED chips of multiple colors at a time, thereby enabling the Micro LED component array to be manufactured in shorter period and more efficient.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. indicate the orientation or positional relationship based on the orientation or positional relationship shown in the drawings, only for the convenience of describing the present disclosure and simplifying the description, rather than indicating or implying the apparatus or elements must have a specific orientation, be constructed and operated in a specific orientation, and therefore cannot be construed as limiting the present disclosure.

In addition, the terms "first", "second", and "third" are for descriptive purposes only, and cannot be understood as indicating or implying relative importance or implicitly indicating the number of indicated technical features. Thus, the features defined as "first", "second", and "third" may explicitly or implicitly include at least one of the features. In the description of the present disclosure, the meaning of "plurality" is at least two, for example, two, three, etc., unless specifically defined otherwise.

In the description of this specification, the description referring to the terms "one embodiment", "some embodiments", "examples", "specific examples", or "some examples" means specific features, structures, materials or characteristics described in conjunction with the embodiment(s) or example(s), is/are included in at least one embodiment or example of the present disclosure. In this specification, the schematic representation of the above terms does not necessarily refer to the same embodiment or example. Moreover, the specific features, structures, materials, or characteristics described may be combined in any suitable manner in any one or more embodiments or examples. In addition, without contradicting each other, those skilled in the art may combine and link different embodiments or examples and features of the different embodiments or examples described in this specification.

Although the embodiments of the present disclosure have been shown and described above, it should be understood that the above-mentioned embodiments are exemplary and cannot be construed as limiting the present disclosure. Those skilled in the art may make changes, modifications, substitutions, and variations to the above-described embodiments within the scope of the present disclosure.

What is claimed is:

1. A method for mass transfer of Micro LEDs, comprising:
    providing Micro LED chips, the Micro LED chips comprising first Micro LED chips capable of emitting a first color, second Micro LED chips capable of emitting a second color, and third Micro LED chips capable of emitting a third color, the first color being different from the second color, the third color being different from the first color and the second color, a shape of the first Micro LED chips being different from a shape of the second Micro LED chips, and a shape of the third Micro LED chips being different from the shape of the first Micro LED chips and the shape of the second Micro LED chips;
    dumping at one time the first Micro LED chips, the second Micro LED chips and the third Micro LED chips onto a transfer surface of a transfer mold, the transfer surface being formed with first type transfer cavities, second type transfer cavities, and third type transfer cavities, the first type transfer cavities having a first shape that matches the shape of the first Micro LED chips, the second type transfer cavities having a second shape that matches the shape of the second Micro LED chips, and the third type transfer cavities having a third shape that matches the shape of the third micro LED chips; and
    vibrating the transfer mold to cause the first, second and third Micro LED chips to fall into the first, second and third type transfer cavities respectively, and tilting the transfer mold so that the Micro LED chips that have not fallen into the first, second and third type transfer cavities leave the transfer surface,
    wherein the first Micro LED chips have an isosceles trapezoidal lateral section, the second Micro LED chips have a right-angle-at-left trapezoidal lateral section, and the third Micro LED chips have a right-angle-at-right trapezoidal lateral section.

2. The method of claim 1, wherein each of the first, second and third Micro LED chips has a substantially trapezoidal longitudinal section.

3. The method of claim 2, wherein the trapezoidal longitudinal section of each of the first, second and third Micro LED chips has an included angle within a range of approximately 75° to approximately 85°.

4. The method of claim 1, wherein a ratio of the first Micro LED chips, the second Micro LED chips to the third Micro LED chips in quantity is approximately 1:1:1.

5. The method of claim 1, wherein an angle of tilting of the transfer mold is within a range of approximately 15° to approximately 30°.

6. The method of claim 1, further comprising:
    detecting the transfer surface with an automatic optical inspection equipment, and filling, with a manipulator, empty transfer cavities with shape-matched Micro LED chips respectively;
    testing component function of the Micro LED chips on the transfer mold, removing, with the manipulator, defective Micro LED chips, and then filling non-defective shaped-matched Micro LED chips; and
    soldering and packaging the Micro LED chips on the transfer mold to a circuit board in position.

7. An apparatus for mass transfer of Micro LEDs, comprising:
    a transfer mold, having a transfer surface that is formed with first type transfer cavities, second type transfer cavities and third type transfer cavities, the transfer cavities of each type having a shape suitable to match a shape of Micro LED chips with one same color; and
    a vibrating source in contact with the transfer mold,
    wherein the first type transfer cavities have an isosceles trapezoidal lateral section, the second type transfer cavities have a right-angle-at-left trapezoidal lateral section, and the third type transfer cavities have a right-angle-at-right trapezoidal lateral section.

8. The apparatus of claim 7, wherein each of the transfer cavities has a vacuum suction hole provided at a bottom thereof.

9. The apparatus of claim 7, wherein each of the transfer cavities has a depth in a range of approximately 2.5 microns to approximately 5 microns.

* * * * *